United States Patent [19]

Tamagawa

[11] Patent Number: 5,045,900

[45] Date of Patent: Sep. 3, 1991

[54] SEMICONDUCTOR DEVICE HAVING A VERTICAL POWER MOSFET FABRICATED IN AN ISOLATED FORM ON A SEMICONDUCTOR SUBSTRATE

[75] Inventor: Akio Tamagawa, Tokyo, Japan

[73] Assignee: NEC Corporation, Tokyo, Japan

[21] Appl. No.: 643,105

[22] Filed: Jan. 22, 1991

Related U.S. Application Data

[63] Continuation of Ser. No. 263,215, Oct. 27, 1988, abandoned.

[30] Foreign Application Priority Data

Oct. 27, 1987 [JP] Japan .................................. 62-272223

[51] Int. Cl.[5] ............................................. H01L 29/10
[52] U.S. Cl. ...................................... 357/23.4; 357/42; 357/48; 357/52
[58] Field of Search ..................... 357/42, 48, 23.4, 52, 357/23.14, 41, 50

[56] References Cited

U.S. PATENT DOCUMENTS 4,862,233  8/1989  Matsushita et al. ................ 357/23.4

FOREIGN PATENT DOCUMENTS

61-196568  8/1986  Japan .................................. 357/23.4

Primary Examiner—Andrew J. James
Assistant Examiner—Courtney A. Bowers
Attorney, Agent, or Firm—Sughrue, Mion, Zinn, Macpeak & Seas

[57] ABSTRACT

A semiconductor device includes an N-type semiconductor substrate, an N-channel type vertical MOSFET formed in the semiconductor substrate, a source electrode connected to a source region of the vertical MOSFET formed in the upper surface of the semiconductor substrate, a drain electrode of the vertical MOSFET formed on the bottom surface of the semiconductor substrate, a CMOS circuit formed in the upper surface of the semiconductor substrate to control the operation of the vertical MOSFET and a P-type diffused region formed between the vertical MOSFET and the CMOS circuit. The drain electrode is to be connected to a first power line, the source electrode being to be connected to a load connected to a second power line.

11 Claims, 8 Drawing Sheets

SEMICONDUCTOR DEVICE HAVING A VERTICAL POWER MOSFET FABRICATED IN AN ISOLATED FORM ON A SEMICONDUCTOR SUBSTRATE

This is a continuation of application Ser. No. 07/263,215 filed Oct. 27, 1988, now abandoned.

BACKGROUND OF THE INVENTION

1. Field of the Invention

The present invention relates to a semiconductor device and, more particularly, to a semiconductor device having a plurality of circuit elements including a vertical MOSFET isolated from the other circuit elements.

2. Description of the Related Art

Recently, vertical MOSFET's have been employed as switching devices for driving loads, such as lamps and solenoid relays. There has recently been proposed an integrated circuit device wherein a vertical MOSFET and a plurality of peripheral circuit elements are integrated on the same one chip by making use of the advantages that the process for manufacturing a vertical MOSFET and a CMOS IC on the same chip is developed and that various kinds of protecting circuits such as a current-limiting circuit, an overheating-detection circuit, an overvoltage-detection circuit are put into practice by using these peripheral circuit elements to protect the vertical MOSFET from a large current due to a short-circuitting of its load or an application of a high-voltage surge.

In the integrated circuit device having a vertical MOSFET as an output transistor and other circuit elements formed on the same chip, the vertical MOSFET must be isolated from the other circuit elements. A junction isolation, and a dielectric isolation are examples of the isolation structure in the prior art.

Figure 5:
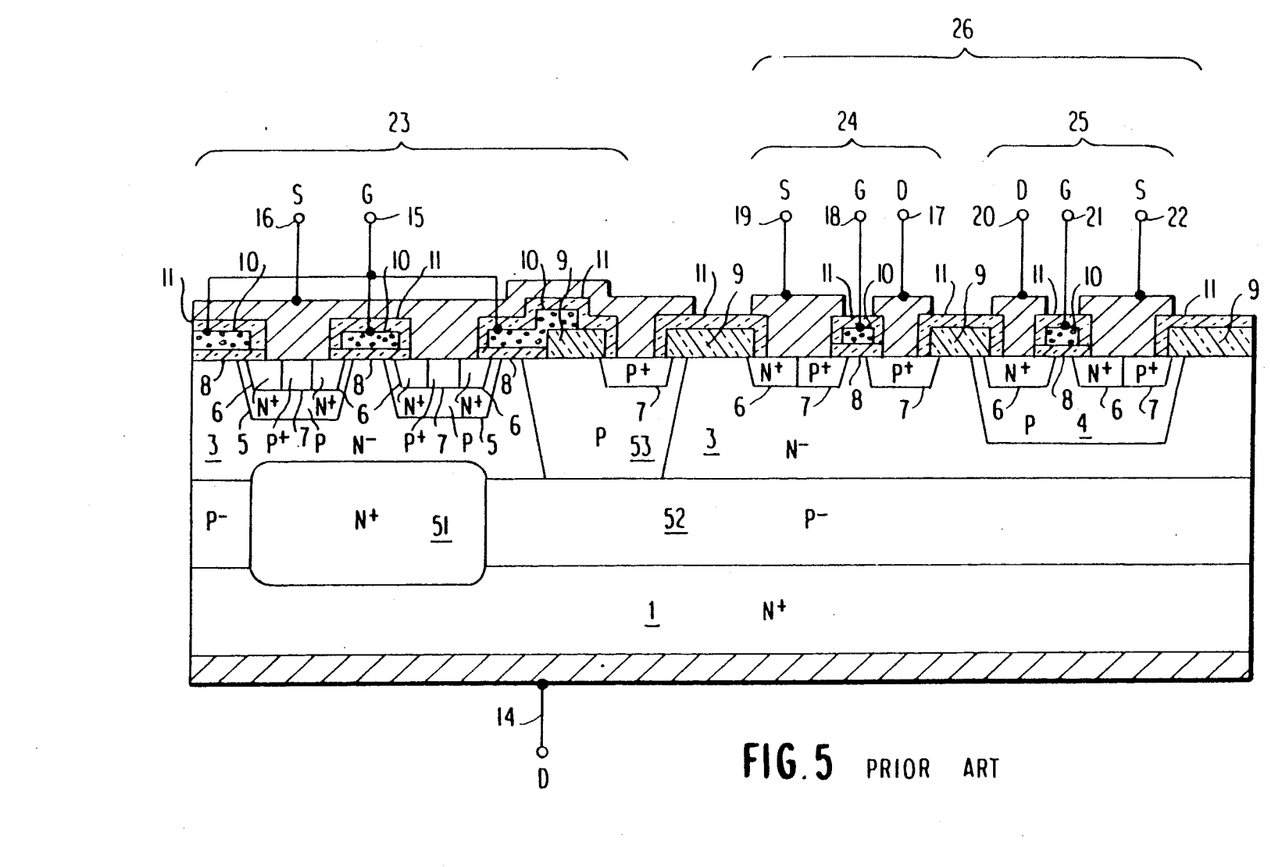
FIG. 5 is a sectional view showing junction isolation structure of the prior art.
Figure 6:
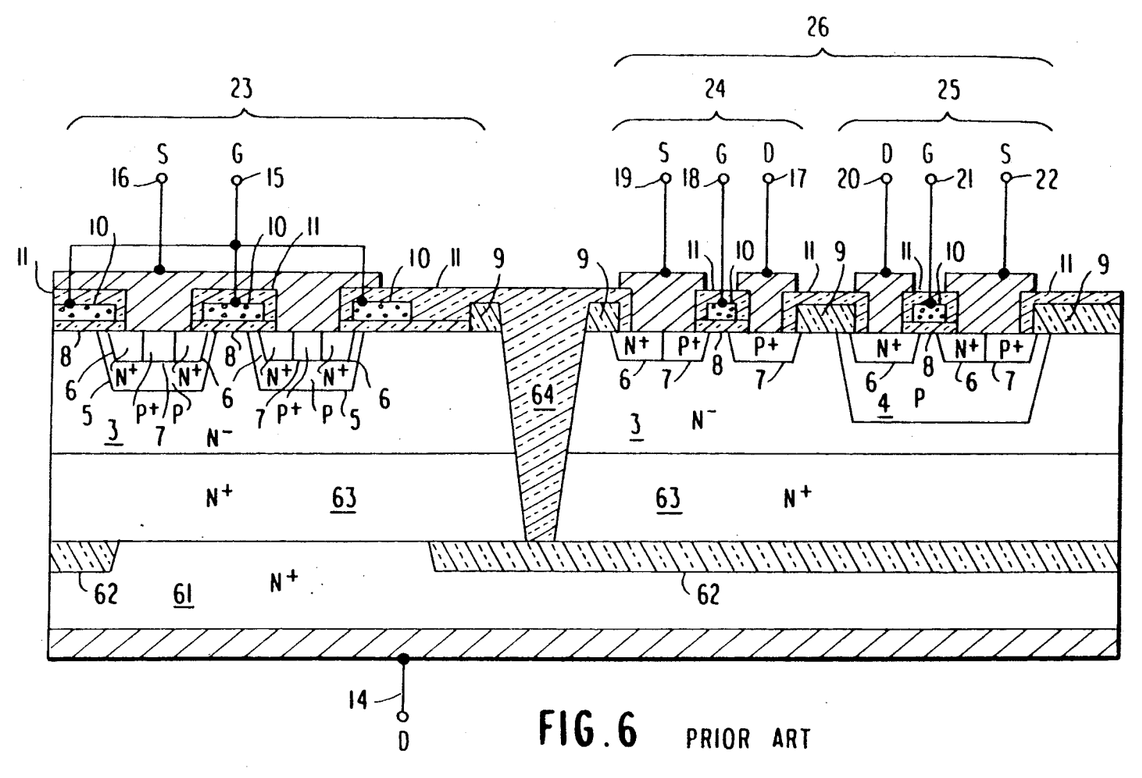
FIG. 6 is a sectional view showing a dielectric isolation structure of the prior art.

FIG. 5 shows the junction isolation structure in a prior art (see IEEE 1987 CUSTOM INTEGRATED CIRCUIT CONFERENCE, p. 276), while FIG. 6 shows the dielectric isolation structure in another prior art (see Japanese Patent Laid-Open No. 196576/1986). These conventional isolation structures suffer, however, from the disadvantage that the manufacturing process is complicated and the production cost is high.

For example, in the junction isolation structure shown in FIG. 5, after an N+ buried layer 51 is provided in an N+-substrate 1, a P-type epitaxial layer 52 and an N-type epitaxial layer 3 are stacked thereon successively. Then, a P-type impurity is diffused into the N-type epitaxial layer 3 from the surface to form a P-type diffused layer 53 for isolation. Thus, this structure requires a complicated process.

In the dielectric isolation structure shown in FIG. 6, after the bottom surface of an N+-substrate 63 is oxidized to form an internal oxide film 62 for isolation, the internal oxide film 62 in a region where a vertical MOSFET 23 is to be formed is partially etched away. Then, an N+ polysilicon layer 61 is deposited on the bottom surface of the N+-substrate 63, followed by growing an N− epitaxial layer 3 on the upper surface of the N+-substrate 63. Finally a trench 64 is provided to effect isolation by filling phosphosilicate glass (PSG) 11. This structure requires to effect alignment between the obverse and reverse sides of the substrate 63 and to provide the trench 64 having a relatively deep depth. Thus, the manufacturing process includes technically difficult steps.

As shown in FIGS. 5 anc 6, vertical MOSFET uses the N+-substrate 1 or 63 as its drain region. Therefore, when the drain region is directly connected to an output terminal, a load is connected between the output terminal and the positive or negative power source line. The voltage at the drain region of vertical MOSFET changes in accordance with the output state. On the other hand, the potential at the substrate 3, 63 of the other CMOS circuit portion 26 and the potential at a well 4 need to be fixed. Therefore, the substrate and the well for other circuit portion 26 must be isolated from the drain region of the vertical MOSFET. Accordingly, it is necessary to electrically isolate the vertical MOSFET from the other circuit elements by use of an isolation structure such as the above-described junction isolation or dielectric isolation.

On the other hand, in automotive electrical circuits, the automobile body itself is used as a grounding electrode with a view to reducing the number of interconnections. In the case where the loads such as lamps and solenoid relays in motorcars are driven by using the vertical MOSFET, the loads are connected with the automobile body for preventing them from breaking down by a surge voltage introduced into the positive power line by sparking in engine. This results in an connection of the vertical MOSFET operating as switching devices for driving these loads between those load and the positive power source line. This type of switching device is known as a high-side switch.

The high-side switch may be formed by using an N-channel vertical MOSFET. The drain of the N-channel MOSFET is connected to the positive power supply side and the source thereof is employed to constitute an output terminal which is connected to a electrode of a power load such as a lamp and a solenoid relay for motorcars.

As described above, in the high-side switch, the output terminal is connected to the source electrode and the potential at the drain electrode is fixed to a power supply voltage which is common to the other circuit elements. Therefore, it is possible to form a vertical MOSFET and the other circuit elements on a common substrate. However, since the vertical MOSFET used as an output transistor is employed to switch a high voltage and a large current, a large current flows between the source of the vertical MOSFET and the drain region thereof which is common to the substrate of the other circuit elements, resulting in changing the substrate potential. If the substrate potential near the other circuit element lowers, the PN junction between the substrate and source or drain region becomes forward bias to cause latch-up in the portion of the other circuit. Accordingly, a current path must be limited so that there is no adverse effect on the other circuit elements by contriving the device structure. In this case, the device structure must also be contrived to reduce the required numbers of manufacturing steps for easiness of manufacture and low production cost.

SUMMARY OF THE INVENTION

It is, therefore, a major object of the present invention to provide a semiconductor device in which a vertical MOSFET and other circuit elements are formed on a common substrate of a same chip with a simple device structure for manufacturing the device with low cost.

The semiconductor device in accordance with the present invention includes a semiconductor substrate of one conductivity type, a first electrode formed on an upper surface of the semiconductor substrate, a second electrode formed on a bottom surface of the semiconductor substrate, a switching device for switching a current flowing between the first electrode and the second electrode, at least one circuit element formed in the upper surface of the semiconductor substrate, and a diffused region of the other conductivity type formed between the switching device and the circuit element.

The at least one circuit element favorably forms a control circuit of the switching device using a complementary MOS circuit. The switching device and the circuit element are favorably an N-channel type vertical MOSFET and a lateral MOSFET, respectively, and the semiconductor substrate favorably has an N-type semiconductor layer in the upper surface thereof, an N-type source and a P-type base of the N-channel type vertical MOSFET and a source and a drain of the lateral MOSFET being formed in the N-type semiconductor layer, and a depth xj of a PN junction between the P-type diffused region and the N-type semiconductor substrate and a depth xe of a region where a concentration of the N-type semiconductor substrate under the P-type diffused region is equal to that of the N-type semiconductor layer having a relation of xj/xe >0.7.

Unlike the prior art in which a vertical MOSFET is electrically isolated from other circuit element, the present invention employs a relatively deep P-type diffused layer to limit the output current path of the vertical MOSFET, thereby reducing the effect on the other circuit elements, and thus simplifying the device structure as well as facilitating the manufacturing process.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
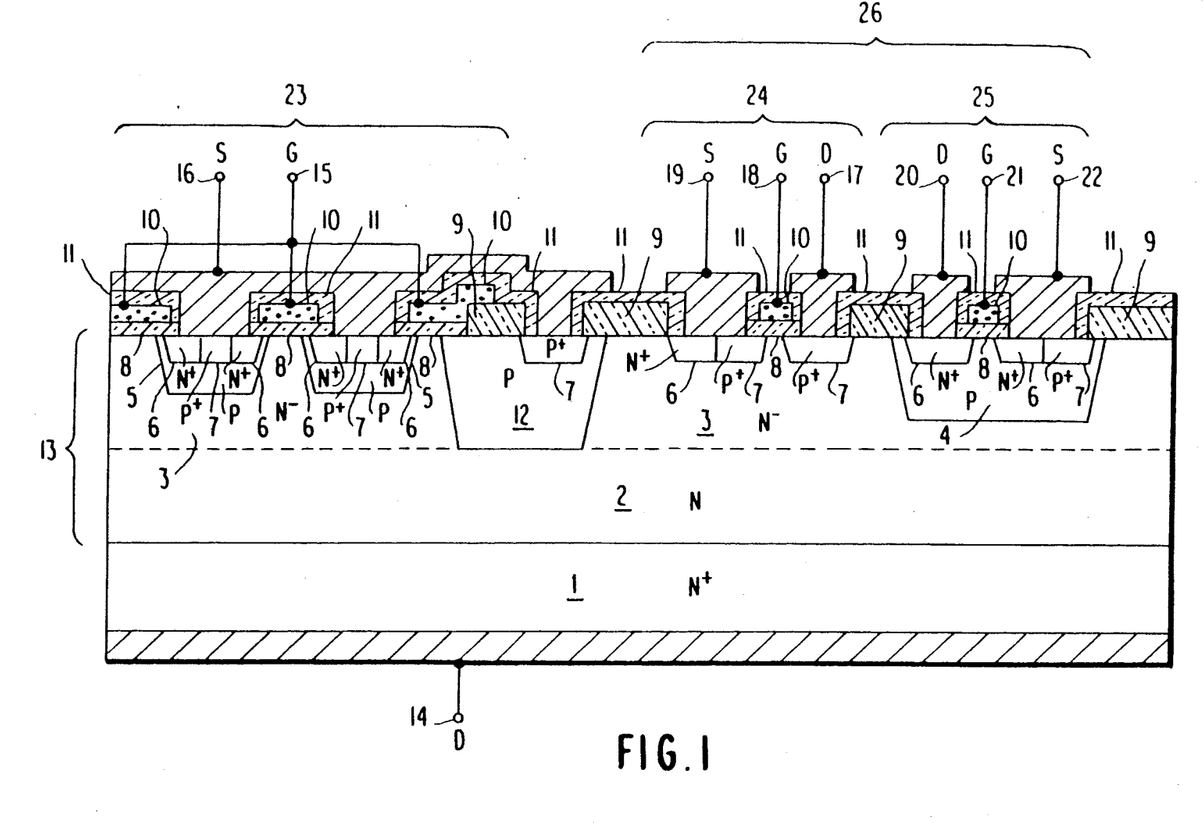
FIG. 1 is a sectional view for explaining a first embodiment of the present invention.

FIG. 1 is a sectional view of a first embodiment of the present invention. In this embodiment, is used an epitaxial wafer which has an N+-substrate 1 of 440 μm in thickness and an N-type epitaxial layer 13 of 25 μm in thickness stacked thereon. This epitaxial wafer is the same as that employed to manufacture discrete vertical MOSFETs. However, the thickness of the epitaxial layer 13 before impurity diffusion carried out to form a relatively deep P-type diffused region 12 is set so as to be greater than that in the case of manufacturing discrete vertical MOSFETs, because when the deep P-type diffused region 12 is formed subsequently, diffusion of an impurity from the N+-substrate 1 takes place to form an N+ raised region 2, resulting in a reduction in the effective thickness of the epitaxial film 13. Since the semiconductor devices for motorcars are ordinarily required to have a breakdown voltage of about 60 V, the resistivity of the epitaxial layer 13 is set at about 1Ω·cm. In this case, the thickness of the epitaxial layer 13 required before the impurity diffusion for the P-type diffused layer 12 is about 20 to 30 μm.

Boron is introduced into the region between a vertical MOSFET 23 and a control circuit 26 by ion implantation or the like and impurity diffusion is carried out at high temperature to form a deep P-type diffused region 12 for isolation. As a result of the impurity diffusion carried out at high temperature for a long period of time, diffusion of an impurity from the N+-substrate 1 takes place to form an N+ raised region 2. The thickness of the epitaxial film 13 and the impurity diffusion time for the P-type diffused region 12 are set so that the P-type diffused region 12 for isolation nearly contacts the N+ raised region 2. When an epitaxial wafer which has an epitaxial layer 13 of 1Ω·cm in resistivity and of 25 μm in film thickness before impurity diffusion is used, an N+ raised region 2 of about 13 μm in thickness is formed by carrying out impurity diffusion at 1200° C. for 50 hours. When the concentration of implanted boron ions is set at $1.5 \times 10^{13}$ cm$^{-3}$, the depth of the P-type diffused region 12 is about 11 μm. Thereafter, the vertical MOSFET 23 and the control circuit 26 are formed.

On the N⁻ epitaxial layer 3 on the left-hand side of the P-type diffused region 12, are selectively formed a gate oxide film 8 and a polysilicon gate electrode 10 thereon. This polysilicon gate electrode 10 is covered by a phosphosilicate glass (PSG) film 11. Using the polysilicon gate electrode 10 as a diffusion mask, P-type impurity is diffused into the N⁻ epitaxial layer 3 to form a P-base region 5 to 3 μm in depth and N-type impurity is also diffused into the P-base region 5 to form an N+ source region 6. This N+ source region 6 is connected to a source electrode 16. The P-base region 5 is also connected to the source electrode 16 by a P+ diffused region 7. The P-type diffused region 12 is connected with the source electrode 16 through a hole formed in a field oxide film 9 and by using the P+ diffused region 7. A drain electrode 14 is formed on a bottom surface of the N+ substrate 1.

In the N⁻ epitaxial layer 3 on the right-hand side of the P-type diffused region 12, a P-channel type lateral MOSFET 24 and an N-channel type lateral MOSFET 25 are formed to constitute a CMOS control circuit 26. A polysilicon gate 10 is formed on the gate oxide film 8 and P+ diffused regions 7 of 1 μm in depth are formed on both sides of the polysilicon gate 10 to constitute the P-channel type MOSFET 24. The P+ diffused region 7 on the right-hand side and the left-hand side are connected to a drain electrode 17 and a source electrode 19, respectively. The N⁻ epitaxial layer 3 is also connected to the source electrode 19 by the N+ diffused region 6 of 1 μm in depth.

A polysilicon gate 10 is formed on the gate oxide film 8 and N+ diffused regions 6 of 1 μm in depth on both sides of the polysilicon gate 10 are formed in the P-well 4 of 6 μm in depth to constitute the N-channel type MOSFET 25. The N+ diffused regions 6 on the left-hand side and the right-hand side are connected to a drain electrode 20 and a source electrode 22, respectively. The P-well is also connected to the source electrode 22 by a P+ diffused region 7 of 1 μm in depth. The N+ diffused region 6 used in the N-channel type MOSFET 25 and the P-channel type MOSFET 24 and the N+ diffused region 6 used in the vertical MOSFET 23 are formed simultaneously, the P+ diffused region 7 used in the P-channel type MOSFET 24 and the N-channel type MOSFET 25, the P+ diffused region 7 in the P-type diffused region 12 and the P+ diffused region 7 used in the vertical MOSFET 23 being also formed simultaneously.

Figure 2A:
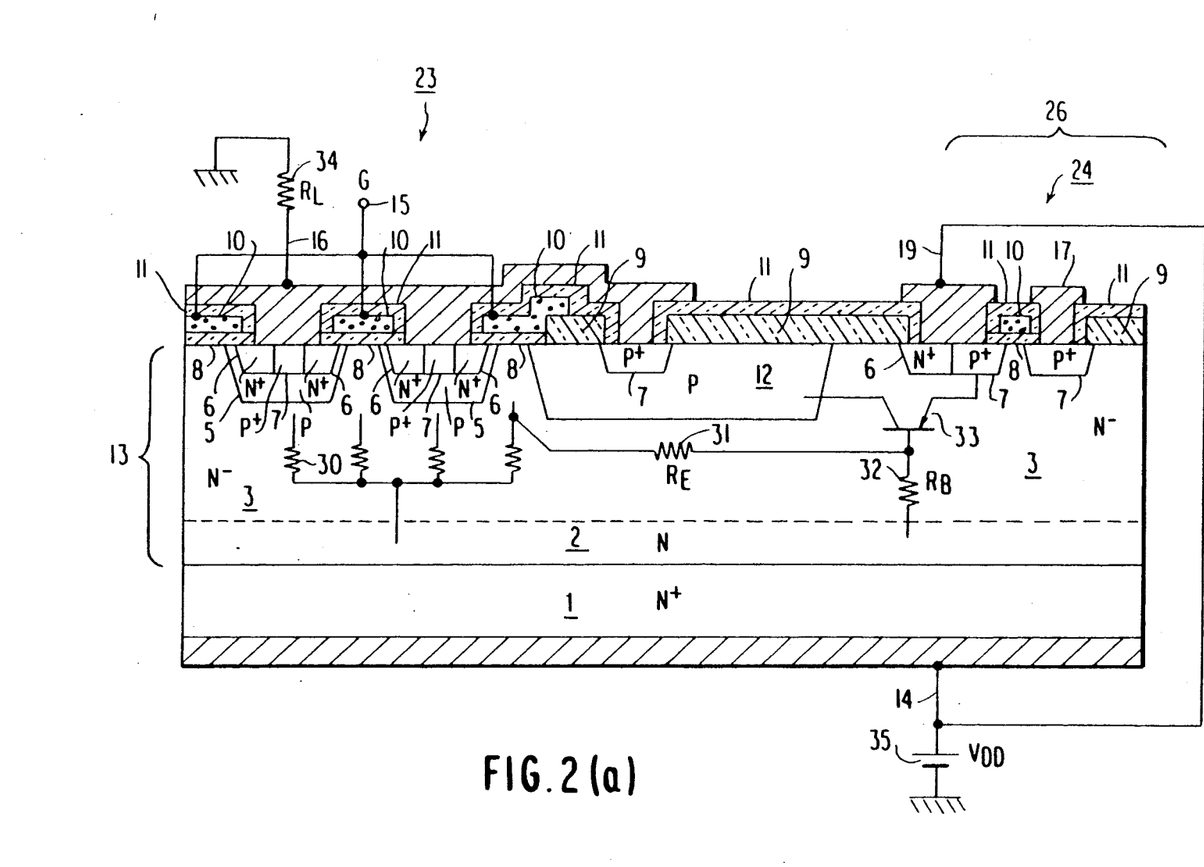
FIGS. 2(a) and 2(b) are sectional views for explaining a first embodiment of the present invention and respectively showing a structure which has a relatively shallow P-type diffused region and a structure which has a relatively deep P-type diffused region.

FIG. 2(a) is a sectional view of an integrated circuit device which has a relatively shallow P-type diffused region 12 between a vertical MOSFET 23 and a control circuit 26. In this figure, illustration of the N-channel type MOSFET 25 shown in FIG. 1 is omitted. Since the device shown in FIG. 2(a) is a high-side switch, the drain 14 of the vertical MOSFET 23 and the source 19 of the P-channel MOSFET 24 are connected to a power supply 35, while the source 16 of the vertical MOSFET 23 is connected to a load resistor 34. Since the P-type diffused region 12 is shallow, the base of a parasitic bipolar transistor 33 and the epitaxial resistance 30 of the vertical MOSFET 23 are connected together by an epitaxial resistance 31 below the shallow P-type diffused region 12. As the output current of the vertical MOSFET 23 increases, the voltage drop across the epitaxial resistance 30 of the vertical MOSFET 23 increases. As a result, the base of the parasitic bipolar transistor 33 is biased negative with respect to the emitter thereof, thus causing the parasitic transistor 33 to turn on. A current flowing at this time triggers latch-up of the control circuit 26. It is necessary, in order to avoid latch-up, to widen the width of the shallow P-type diffused region 12 to thereby make the epitaxial resistance 31 below the shallow P-type diffused region 12 greater than that of the base resistance 32 of the parasitic bipolar transistor 33. However, this leads to an increase in the chip area.

Figure 2B:
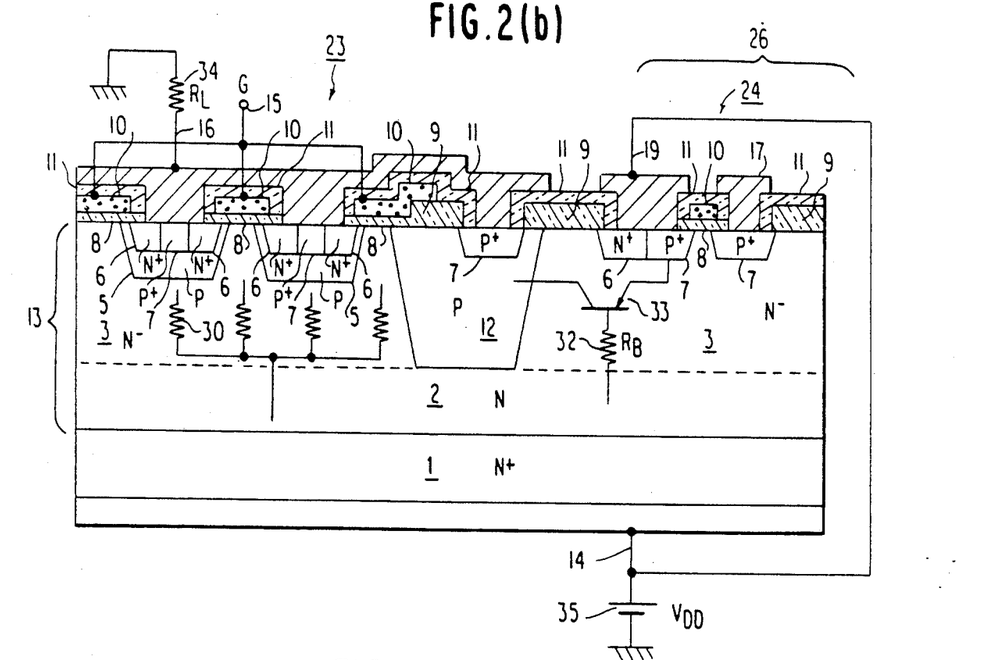

On the other hand, in the structure shown in FIG. 2(b), the output current of the vertical MOSFET 23 has no effect on the control circuit 26 since the deep P-type diffused region 12 is elongated so as to nearly reach the N+ raised region 2. The base of the parasitic bipolar transistor 33 is connected to the N+ raised region 2 through the base resistance 32. This N+ raised region 2, which has a relatively high impurity concentration, is constantly biased to the power supply voltage $V_{DD}$. Accordingly, there is no possibility of the parasitic bipolar transistor 33 turning on. Unlike the structure of FIG. 2(a) in which the P-type diffused region 12 is shallow, the structure shown in FIG. 2(b) has no increase in the chip area.

In the case where the resistivity and thickness of the epitaxial layer 13 before the diffusion of the P-type region 12 are 1Ω·cm and 25 μm, respectively, the depth of the P-type diffused region 12 is about 11 μm, as described above. In this case, if the width of the deep P-type diffused region 12 is set at 15 μm or more, it is possible to avoid latch-up of the control circuit 26. It should be noted that even when the deep P-type diffused region 12 is in contact with the N+ raised region 2, the breakdown voltage is unlikely to be lowered because the PN junction is a graded junction. With the above-described diffusion conditions, a breakdown voltage of about 180 V is obtained, so that there is no particular problem in practical application.

Figure 2C:
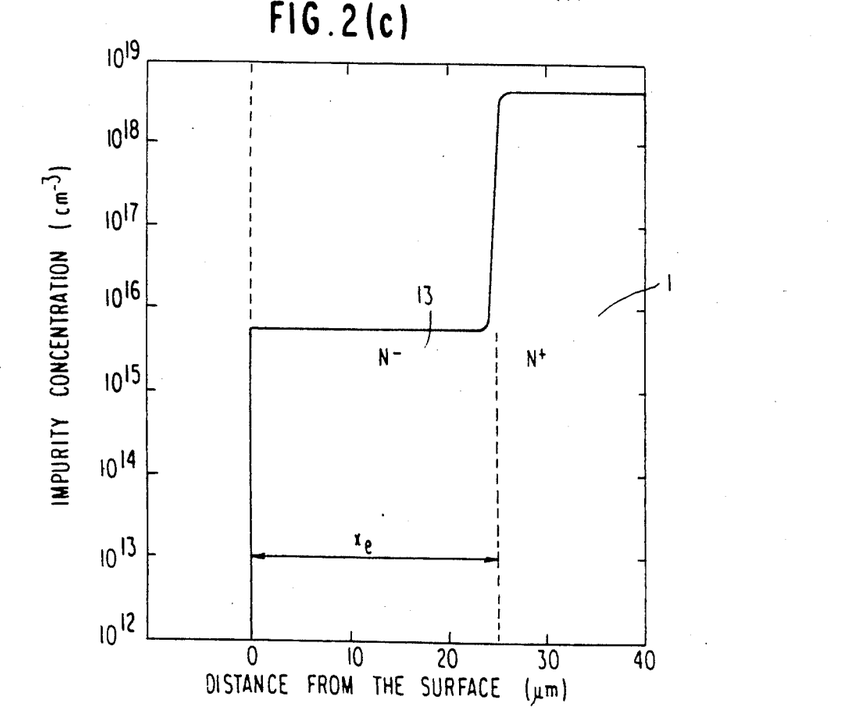
FIGS. 2(c) to 2(e) are diagrams showing impurity distribution profiles for explaining the present invention.
Figure 2D:
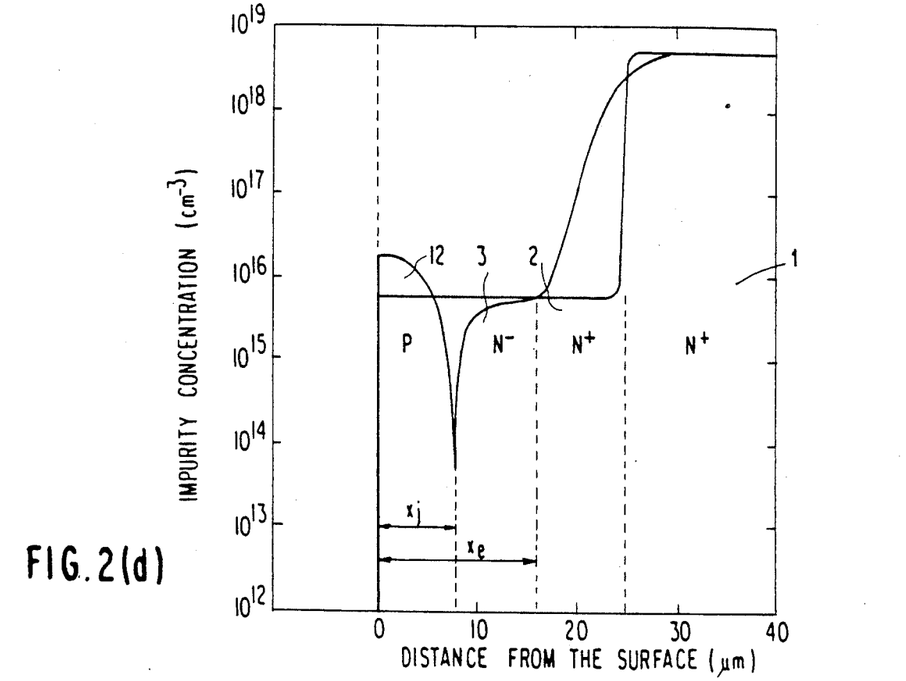
Figure 2E:
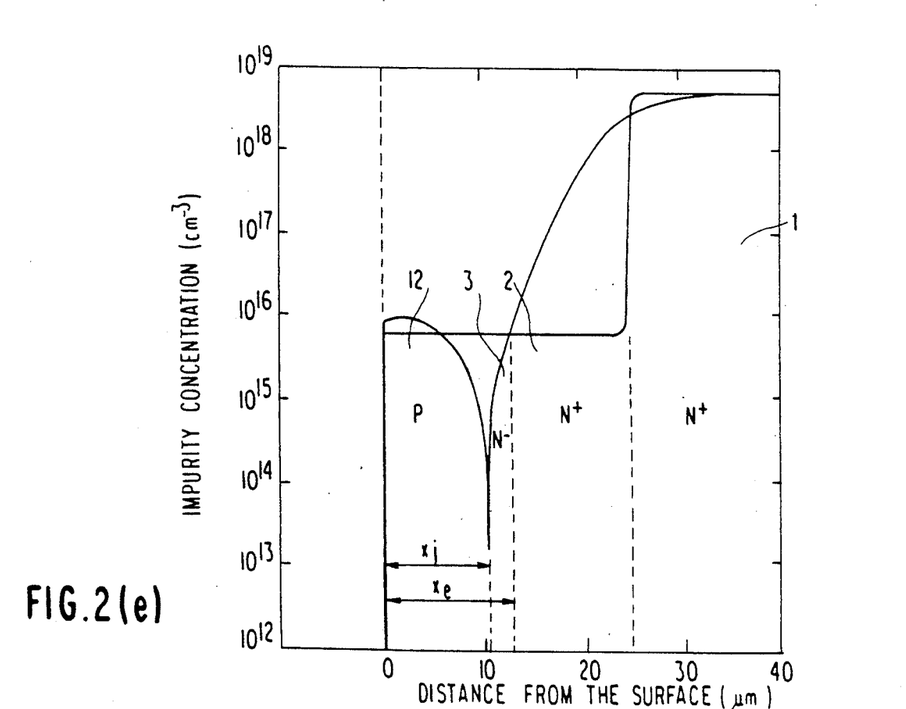

FIGS. 2(c) to 2(e) are diagrams showing impurity distribution profiles under the P-type diffused region 12 obtained by a computer simulation. FIG. 2(c), 2(d) and 2(e) show the impurity distribution profiles before formation of the P-type diffused region 12, after diffusion of P-type diffused region 12 for 750 minutes and after diffusion of P-type diffused region 12 for 3000 minutes, respectively. The diffusion is carried out at 1200° C. and in an inert gas atmosphere.

Since the N+-substrate 1 is connected to the drain electrode 14, its resistivity is selected to be 0.006 to 0.030Ω·cm for ohmic contact. This resistivity corresponds to the impurity concentration of $10^{18}$ to $10^{19}$ cm$^{-3}$. Antimony (Sb) is used as the N-type impurity because of its relatively small diffusion constant. The epitaxial layer 13 of 1.0Ω·cm in resistivity ($5.6 \times 10^{15}$ cm$^{-3}$ in impurity concentration) and of 25 μm in film thickness is formed on the N+-substrate 1. Phosphorus (P) is used as a dopant for this epitaxial layer 13. FIG. 2(c) shows the impurity distribution profiles at this manufacturing step.

FIG. 2(d) shows the impurity distribution profile after implantation of Boron (B) at the dosage of $1.5 \times 10^{13}$ cm$^{-2}$ and the diffusion of Boron for 750 minutes at 1200° C. and in an inert gas atmosphere, and FIG. 2(e) shows the impurity profile after diffusion for 3,000 minutes.

Here, a distance of a PN junction from the surface of the epitaxial layer 13 is denoted by xj. A notation xe of an effective film thickness of the epitaxial layer 2 denotes the distance from the surface of the region where the impurity concentration of the N-region is equal to that of the initial epitaxial layer 13.

Referring to FIG. 2(d), when the diffusion is carried out for 750 minutes, xj is 7.9 μm, xe being 15.9 μm and the ratio of xj to xe is as small as 50%. As a result, the concentration of the N$^-$ region 3 between the P-type diffusion region 12 and the N+ raised region 2 is almost equal to that of the initial epitaxial layer 13. Consequently, the resistance 31 under the P-type diffused region 12 shown in FIG. 2(a) becomes nearly equal to the resistance 32 of the parasitic bipolar transistor 33 to turn on the parasitic transistor 33, resulting in latch-up.

Referring to FIG. 2(e), when the diffusion time is 3,000 minutes, xj is 10.4 μm, xe being 15.9 μm and the ratio of xj to xe is about 80%. When the ratio of xj to xe is larger than 0.7 (xj/xe>0.7), the impurity concentration of the N$^-$ region 3 between the P-type diffused region 12 and the N+ raised region 2 becomes considerably lower than that of the initial epitaxial layer 13. Consequently, the resistance 31 below the P-type diffused region 12 shown in FIG. 2(a) becomes very large and the base resistance 32 of the parasitic bipolar transistor 33 can be ignored. Accordingly, the parasitic bipolar transistor 33 does not turn on and latch-up can be prevented.

The impurity concentration of the N+ substrate 1 is favorably from $10^{17}$ to $10^{20}$ cm$^{-3}$ for the ohmic contact with the drain electrode 14. The thickness of the N+ substrate 1 is favorably from 200 to 900 μm to prevent the wafer from cracking.

The film thickness and the impurity concentration of the epitaxial layer 13 before the formation of the P+-type diffused region 12 is favorably from 20 to 30 μm and from $10^{15}$ to $10^{16}$, respectively, to obtain the large breakdown voltage of 50 to 250 V.

The distance of the P-type diffused region 12 from the surface is favorably from 5 to 20 μm, the width thereof being favorably equal to or more than 10 μm and the impurity concentration of the surface thereof is favorably from $10^{15}$ to $10^{16}$. The thickness of the N+ raised region 2 is favorably from 5 to 25 μm.

Additionally, when the depth of the P-type diffused region 12, the film thickness of the epitaxial layer 13 before formation of the P-type diffused region 12 and the thickness of the N+ raised region 2 are denoted by $x_j$, $x_{epi}$ and $x_N$, respectively, the relation among $x_j$, $x_{epi}$ and $x_N$ is favorably $x_j/(x_{epi}-x_N) > 0.7$, to prevent latch-up by enlarging the resistance 31 under the P-type diffused region 12.

Figure 3:
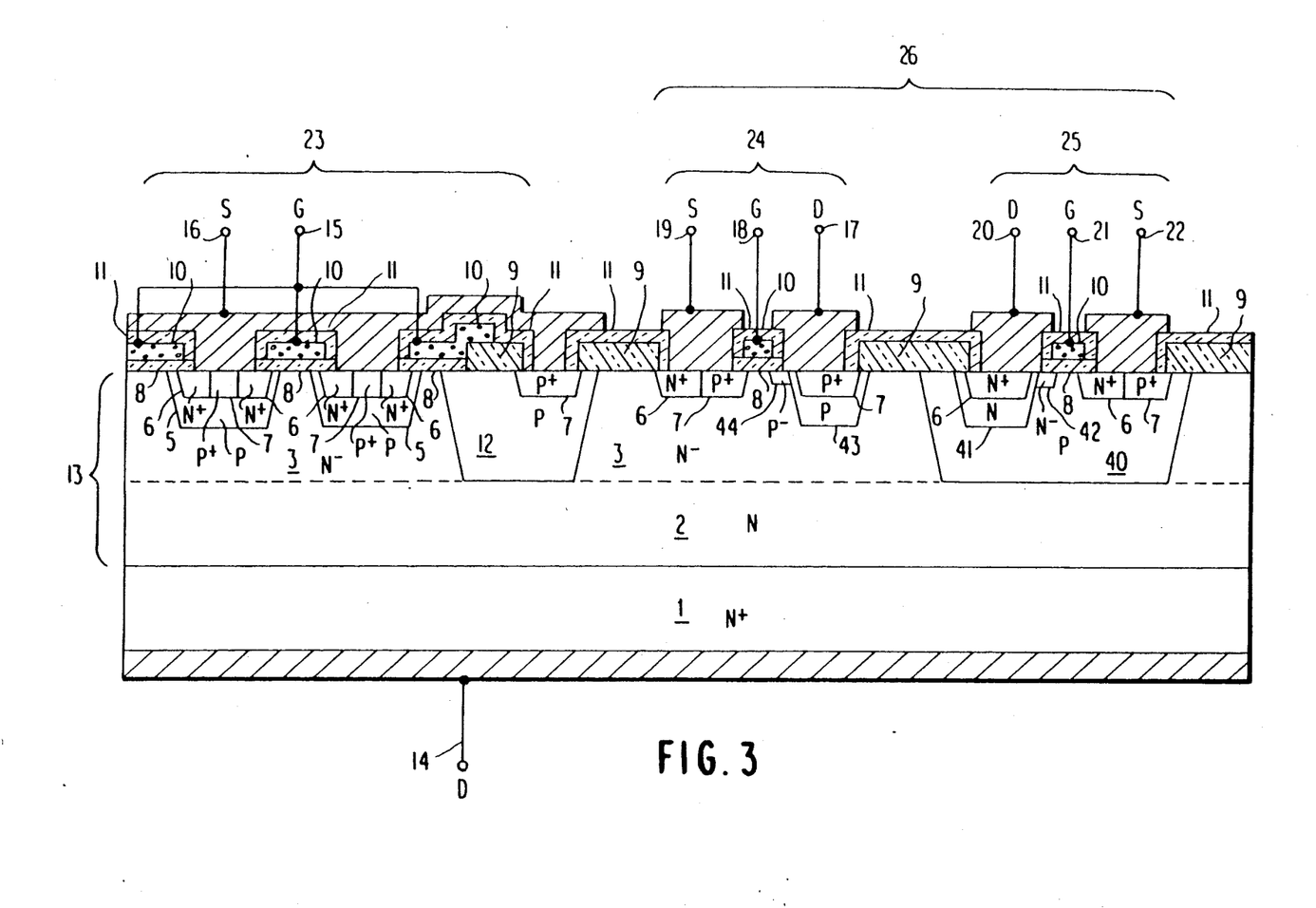
FIGS. 3 and 4 are sectional views respectively showing a second and a third embodiments of the present invention.
Figure 4:
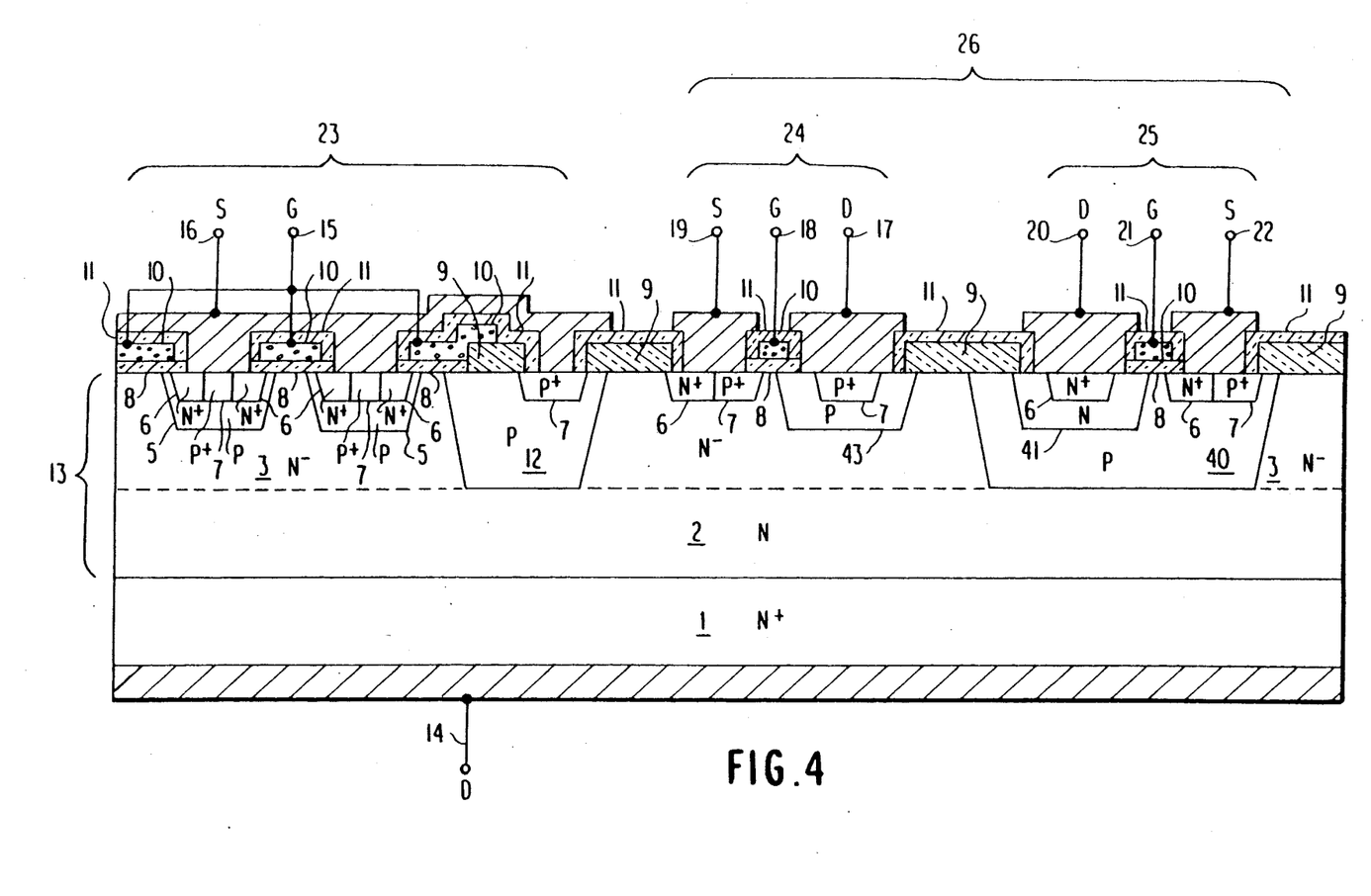

FIGS. 3 and 4 are sectional views of a second and a third embodiments of the present invention, respectively. In these embodiments, a P-well 40 for an N-channel MOS transistor 25 is formed simultaneously with deep P-type diffused region 12 for isolation. Therefore, it is possible to reduce the number of manufacturing steps.

Since the P-type diffused region 12 is relatively deep (for example, about 10 μm), it is possible to form high-voltage N-channel MOSFETs, e.g., an offset gate type N-channel MOSFET such as that shown in FIG. 3 and a double-doped drain (DDD) type N-channel MOSFET such as that shown in FIG. 4. In FIG. 3, an N+-type diffused region 6 is formed in an N-type diffused region 41 of 3 μm in depth and a shallow N− region 42 of 0.5 μm in depth is formed between the N-type diffused region 41 and the gate electrode 10 to form the offset gate type N-channel MOSFET 25. A P-type diffused region 7 is formed in an P-type diffused region 43 of 3.0 μm in depth and a shallow P− region 44 of 0.5 μm is depth is formed between the P-type diffused region 43 and the gate electrode 10 to form an offset gate type P-channel MOSFET 24. In FIG. 4, an N-type diffused region 41 of 3.0 μm in depth and an N+-type diffused region 6 of 1.0 μm in depth are doubly diffused to form a double-doped drain type N-channel MOSFET 25, an P-type diffused region 43 of 3.0 μm in depth and P+-type diffused region 7 of 1.0 μm in depth being doubly diffused to form a double-doped drain type P-channel MOSFET 24. Even if the depth of the drain diffused region 41 is increased to be, for example, 3 μm in order to reduce the strength of the electric field at the drain and thereby achieve a high-voltage device, no punch-through phenomenon occurs between the drain diffused region 41 and the N-type substrate since the P-type diffused region 40 is satisfactorily as deep as 10 μm.

What is claimed is:

1. A semiconductor device comprising:
a semiconductor substrate having a high concentration layer of one conductivity type and a low concentration layer formed on said high concentration layer;
a first electrode formed on an upper surface of said low concentration layer;
a second electrode formed on a bottom surface of said high concentration layer;
a vertical MOSFET formed in said semiconductor substrate for switching a current flowing between said first electrode and said second electrode said vertical MOSFET having a source and a base, and said source and said base being electrically connected to said first electrode;
at least one circuit element formed in said low concentration layer within a first depth; and
a diffused region of the other conductivity type formed in said low concentration layer between said vertical MOSFET and said circuit element with a second depth deeper than said first depth, said diffused region being electrically connected to said first electrode.

2. A semiconductor device as claimed in claim 1, wherein said circuit element is a lateral MOSFET.

3. A semiconductor device as claimed in claim 2, wherein said circuit element forms a complementary MOS circuit.

4. A semiconductor device as claimed in claim 2, wherein said vertical MOSFET is an N-channel type vertical MOSFET, said one conductivity type being N-type and said the other conductivity type being P-type.

5. A semiconductor device as claimed in claim 4, wherein said second depth is from 5 to 20 μm.

6. A semiconductor device as claimed in claim 4, wherein said semiconductor substrate has said low concentration layer of a N-type in said upper surface thereof, said source of said N-channel type vertical MOSFET being N-type, said base of said N-channel type vertical MOSFET being P-type and being formed in said low concentration layer, a source and a drain of said lateral MOSFET being formed in said low concentration layer, and a depth $x_j$ of said second depth and a depth $x_e$ of said low concentration layer having a relation of $x_j/x_e > 0.7$.

7. A semiconductor device comprising:
a semiconductor substrate of one conductivity type having a front surface and a back surface, said semiconductor substrate having a high concentration portion with a bottom face forming said back surface and a low concentration portion formed on said high concentration portion with an upper face forming said front surface;
a first electrode formed on said front surface of said semiconductor substrate to be connected to a first power line of a first power voltage through a load;
a second electrode formed on said back surface of said semiconductor substrate to be connected to a second power line of a second power voltage;
a vertical MOSFET formed in said semiconductor substrate for switching a current flowing between said first electrode and said second electrode, said vertical MOSFET having a source and a base, said source and said base being electrically connected to said first electrode; a control circuit formed in said low concentration portion for controlling said vertical MOSFET; and
a diffused region of the other conductivity type formed in said low concentration portion between said vertical MOSFET and said control circuit, said diffused region being disposed over said high concentration portion and having a depth deeper than that of said control circuit, and said diffused region being electrically connected to said first electrode.

8. A semiconductor device as claimed in claim 7, wherein said vertical MOSFET is an N-channel type vertical MOSFET, said one conductivity type being N-type, said the other conductivity type being P-type, said first power voltage being ground voltage and said second power voltage being positive voltage.

9. A semiconductor device as claimed in claim 8, wherein said control circuit is formed by using lateral MOSFET.

10. A semiconductor device as claimed in claim 9, wherein said depth of said diffused region is from 5 to 20 μm.

11. A semiconductor device as claimed in claim 9, wherein a depth xj of said depth of said diffused region and a depth xe of said low concentration portion have a relation of xj/xe>0.7.

* * * * *